United States Patent
Kim et al.

(10) Patent No.: US 10,096,595 B2
(45) Date of Patent: Oct. 9, 2018

(54) ANTENNA DIODE CIRCUIT FOR MANUFACTURING OF SEMICONDUCTOR DEVICES

(71) Applicant: GLOBALFOUNDRIES INC., Grand Cayman (KY)

(72) Inventors: Juhan Kim, Santa Clara, CA (US);
Mahbub Rashed, Sunnyvale, CA (US);
Navneet Jain, Milpitas, CA (US);
Anurag Mittal, Sunnyvale, CA (US);
Sangmoon Kim, Sunnyvale, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 34 days.

(21) Appl. No.: 15/286,196

(22) Filed: Oct. 5, 2016

(65) Prior Publication Data
US 2017/0125403 A1    May 4, 2017

Related U.S. Application Data

(60) Provisional application No. 62/247,520, filed on Oct. 28, 2015.

(51) Int. Cl.
*H01L 27/02* (2006.01)
*H01L 27/06* (2006.01)
(Continued)

(52) U.S. Cl.
CPC ...... *H01L 27/0629* (2013.01); *G06F 17/5072* (2013.01); *H01L 27/0207* (2013.01); *H01L 27/1104* (2013.01); *H01L 29/6609* (2013.01)

(58) Field of Classification Search
CPC ............ H01L 27/0629; H01L 27/0207; H01L 27/1104; H01L 29/6609
See application file for complete search history.

(56) References Cited

U.S. PATENT DOCUMENTS

| | | | |
|---|---|---|---|
| 2009/0003105 A1 | 1/2009 | Itoh et al. | |
| 2014/0077300 A1* | 3/2014 | Noel | H01L 27/1108 257/351 |

(Continued)

FOREIGN PATENT DOCUMENTS

| | | |
|---|---|---|
| TW | 200503231 A | 1/2005 |
| TW | 200505021 A | 2/2005 |

OTHER PUBLICATIONS

Taiwan Intellectual Office Examination Report dated Jun. 19, 2017, issued in co-pending Taiwan Application No. 105133534, filed Oct. 18, 2016.

*Primary Examiner* — Davienee Monbleau
*Assistant Examiner* — Leslie Pilar Cruz
(74) *Attorney, Agent, or Firm* — Williams Morgan, P.C.

(57) ABSTRACT

At least one method, apparatus and system disclosed involves an antenna diode design for a semiconductor device. A first common diode operatively coupled to a ground node and to a p-well layer serving as an isolated p-well that is formed over a deep n-well that is adjacent to an n-well in a semiconductor device is provided. A first antenna diode formed on the isolated p-well operatively coupled to the p-well layer and operatively coupled to a first signal line of the semiconductor device is provided for discharging accumulated charges on the first signal line. A second antenna diode formed on the isolated p-well operatively coupled to the p-well layer and operatively coupled to a second signal line of semiconductor device is provided for discharging accumulated charges on the second signal line.

20 Claims, 7 Drawing Sheets

(51) Int. Cl.
*G06F 17/50* (2006.01)
*H01L 27/11* (2006.01)
*H01L 29/66* (2006.01)

(56) References Cited

U.S. PATENT DOCUMENTS

2014/0176216 A1* 6/2014 Thonnart ............... H03K 3/012
 327/294
2015/0077887 A1 3/2015 Nair

* cited by examiner

ANTENNA DIODE CIRCUIT FOR MANUFACTURING OF SEMICONDUCTOR DEVICES

FIELD OF THE INVENTION

Generally, the present disclosure relates to the manufacture of sophisticated semiconductor devices, and, more specifically, to employing antenna diode circuits for manufacturing of semiconductor devices (e.g., standard cells, memory devices, etc.) having FDSOI technology.

DESCRIPTION OF THE RELATED ART

Memory devices are an important part of electronic devices. There is an ever-growing demand for memory devices that provide more efficient operations. Therefore, designers are constantly attempting to improve semiconductor processing to manufacture better memory devices. The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes. Examples of these semiconductor devices include devices made using field effect transistors (FET), such as the so-called bulk FETs.

In order to address some of the shortcomings of typical bulk FETs, designers have suggested utilizing the so-called fully depleted silicon-on-insulator (FDSOI) FETs. Many devices, such as standard cells, memory devices, etc., are manufactured using FDSOI technology. Various processes are performed on semiconductor substrates in manufacturing these devices. Some of these processes may be plasma based processing. For example, plasma processing in semiconductor manufacturing may include chemical vapor deposition (CVD), etching, dry cleaning (instead of wet chemical rinsing), etc. Some of the processing steps may cause an antenna effect on one or more lines of the circuitry of the devices. Designers have implemented antenna diodes to reduce adverse antenna effects. Some of the issues associated with the implementation of antenna diodes may include inefficiencies in the operation, power consumption, current leakage, and space usage of these devices.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to at least one method, apparatus and system disclosed involves an antenna diode design for a semiconductor device. A first common diode operatively coupled to a ground node and to a p-well layer an isolated p-well that is formed over a deep n-well that is adjacent to an n-well in a semiconductor device is provided. A first antenna diode formed on the isolated p-well operatively coupled to the p-well layer and operatively coupled to a first signal line of the semiconductor device is provided for discharging accumulated charges on the first signal line. A second antenna diode formed on the isolated p-well operatively coupled to the p-well layer and operatively coupled to a second signal line of semiconductor device is provided for discharging accumulated charges on the second signal line.

BRIEF DESCRIPTION OF THE DRAWINGS

The disclosure may be understood by reference to the following description taken in conjunction with the accompanying drawings, in which like reference numerals identify like elements, and in which.

Figure 1:
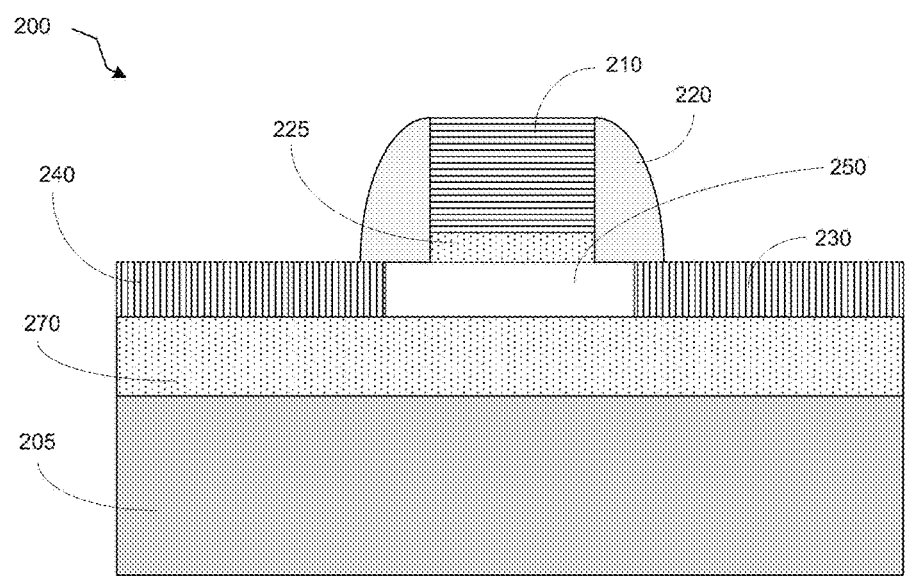
FIG. 1 illustrates a stylized depiction of a fully depleted (FD) SOI FET formed on a semiconductor wafer, which may be implemented into some embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for fabricating memory devices comprising NMOS and/or PMOS devices, such as FD SOI transistors, e.g., 22FDSOI transistors. Embodiments herein provide for a diode arrangement to provide charges on a semiconductor wafer being processed, wherein the charges result from antenna effect on signals lines. Embodiments herein provide for reducing the number of diodes used for antenna-effect charge dissipation, compared to the state of the art system.

Embodiments herein provide for an antenna diode circuit that includes one common forward-bias diode and a plurality of reverse-bias diode. The antenna diode circuit provided by embodiments herein may be implemented into a plurality of circuit types, such as memory devices, functional/standard cells, etc. Functional cells or standard cells may refer to pre-designed circuits that may comprise one or more functional circuitry, such as inverters, AND gates, NAND gates, OR gates, NOR gates, XOR gates, etc.

One or more antenna cells, i.e., antenna diode circuits, may be coupled to a functional/standard cell to provide protection during fabrication. For example, if a standard cell comprises a deep N-well electrically coupled to an N-well, a plurality of antenna cells may be used to protect a plurality of signals coupled to the standard cell. For example, an antenna cell may comprise a first diode and a second diode. The cathode of the first diode is coupled to a signal line of the function cell and anode of the first diode is coupled to an isolated p-well. The anode of the second diode is operatively coupled to the isolated p-well and the cathode is operatively coupled to ground. In this manner, excessive charge accumulated on the signal line of the functional cell is discharged via the diodes, onto ground.

For memory devices that comprise a plurality of arrays arranged in uniform blocks positioned within a predetermined pitch (e.g., SRAM devices), a common forward bias diode may be arranged in an intersection between the two blocks. Further, this forward bias diode may be connected to a p-sub contact layer in a semiconductor wafer without utilizing a reverse diode. Therefore, in order to protect multiple signal lines in the semiconductor wafers, multiple reverse bias diode may be connected to a common P-well feature in the semiconductor wafer, wherein the p-well is floating during process operations. The diodes may be arranged to provide a current path for discharging accumulated charges from the signals lines during manufacturing processes performed on the semiconductor wafer. These diodes are forward biased diodes that are coupled to the isolated p-well region of the semiconductor wafer. This arrangement provides for a reduction in the usage of die area for implementing antenna diodes.

In an exemplary embodiment, in a memory device that comprises decoders and sense amplifiers, the decoders and sense amplifiers may be arranged in a predetermined pitch for each memory array of the memory device. Based upon the predetermined pitch, the common diode may be placed in a first region, while a plurality of signal diodes may be arranged in the predetermined pitch proximate to the array regions.

In some embodiments, a common forward bias diode may be arranged in a common p-well in order to sink the current created by an antenna affect during processing of a semiconductor wafer. The sinking of this current is provided by adding reverse bias diodes in a common p-well region. One advantage provided by this embodiment is that the common diode can be added at the intersection of row decoder and column decoder, wherein the reverse diodes are connected to signal lines or power lines that should be protected from charge accumulation. In this manner, the area-usage in the semiconductor wafer may be reduced, even with the additional reverse biased diodes being implemented for each signal line to be protected. The antenna diodes may be strategically placed to minimize the area used on the semiconductor wafer.

FIG. 1 illustrates a stylized depiction of a fully depleted (FD) SOI FET 200 formed on a semiconductor wafer, which may be implemented into some embodiments herein. The FD-SOI FET 200 is formed on a silicon substrate 205. The FET 200 comprises a depletion region 250 formed by depositing silicon oxide. A gate 210 is formed above the substrate 205, surrounded by insulation 220 formed during the processing of the wafer, and is generally comprised of $HfO_2$.

A gate oxide layer 225 is formed over substrate 205. The gate 210 of the FET 200 is formed over the gate oxide layer 225. The FET 200 also comprises a source region 240 and the drain region 230, which are formed above the substrate 205. If the substrate 205 is of N-type, the drain and source regions 230, 240 would be of P-type, and vice versa. Further, the FET 200 comprises a buried oxide (BOX) region 270 below the drain and source regions 230, 240.

In this configuration, the depletion region 250 is confined above the BOX region 270 and between the drain and source regions 230, 240. The BOX region 270 is formed below the source region 240, the drain region 230, and the depletion region 250. The position of the BOX region 270 prevents the formation of a large depletion region. Further, the depletion region 250, in this case, is fully depleted. If the drain and source regions 230, 240 are of P-type, the depletion region 250 would be an N-type depleted region, and vice versa.

Further, FD-SOI FETs may be configured into a LVT/SLVT format, where a transistor pair comprises an NMOS FET formed over an N-well and a PMOS FET formed over a P-well, also referred to as flip-well configuration. Still further, FD-SOI FETs may be configured into a RVT/HVT format, where a transistor pair comprises an NMOS FET formed over a P-well and a PMOS FET formed over an N-well. These configurations are exemplified below.

One of the advantages of the FD SOI FET design is reduced threshold voltages, which allows for lower operating voltages. Other advantages include lower parasitic capacitance and lower leakage currents. In some cases, targeted biasing voltages, i.e., forward biasing voltages for flip well (LSVT/LVT) configurations, and reverse biasing voltages for conventional well (RVT/HVT) configurations may be provided.

Figure 2:
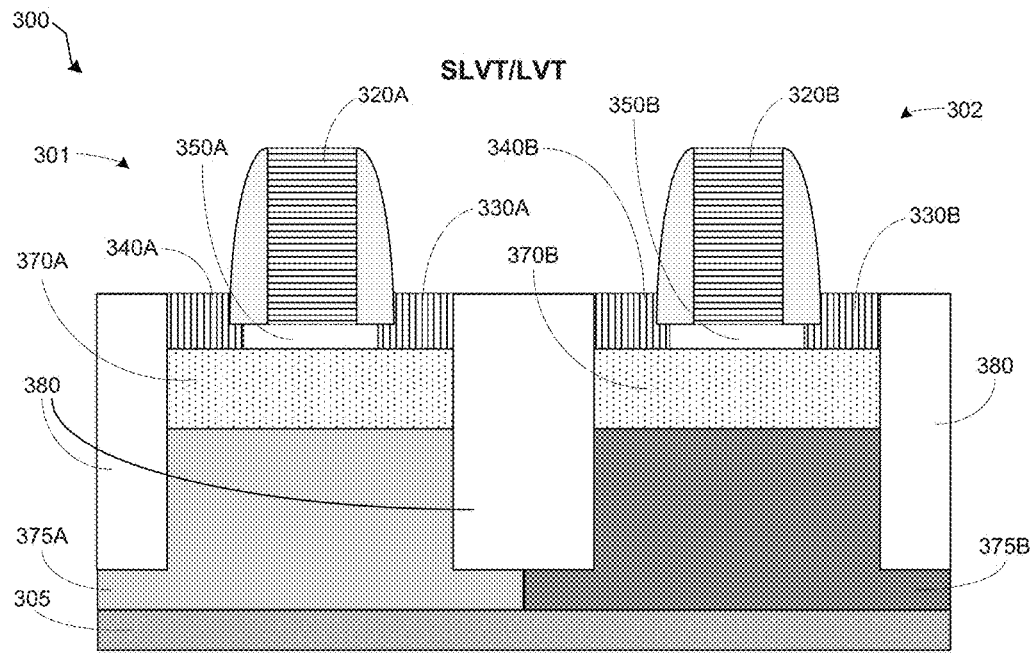
FIG. 2 illustrates a stylized depiction a transistor pair 300 formed in a LVT/SLVT configuration that may be implemented into some embodiments herein.
Figure 3:
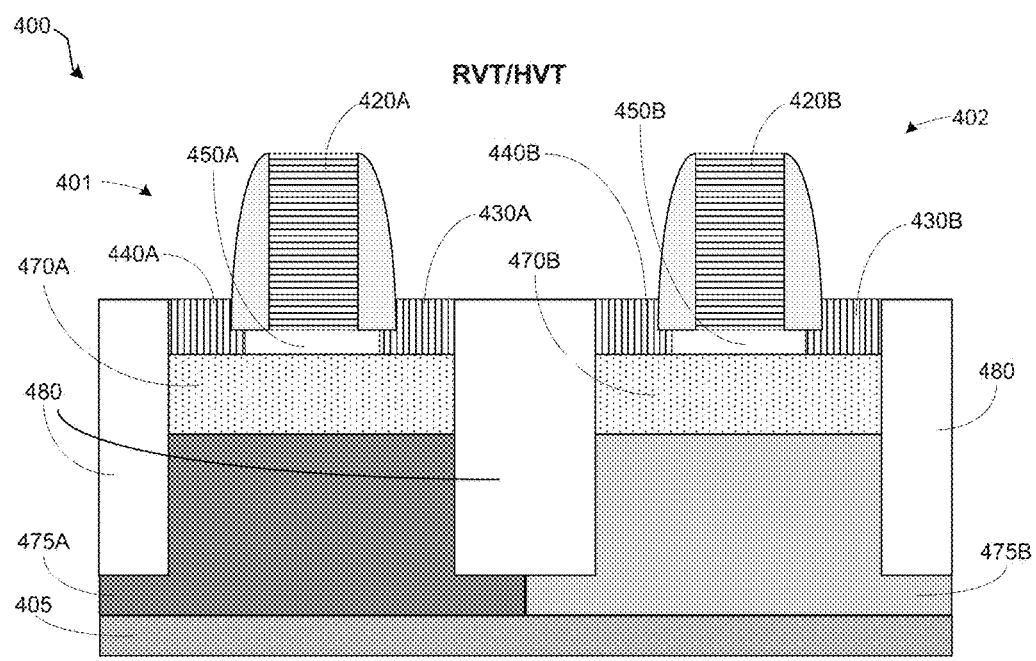
FIG. 3 illustrates a stylized depiction of transistor pair 400 formed in an RVT/HVT configuration that may be implemented into some embodiments herein.

FIG. 2 illustrates a stylized depiction a transistor pair 300 formed in a LVT/SLVT configuration that may be implemented into some embodiments herein. FIG. 3 illustrates a stylized depiction of transistor pair 400 formed in an RVT/HVT configuration that may be implemented into some embodiments herein. Referring simultaneously to FIGS. 2 and 3, a transistor pair 300 (FIG. 2) comprises an NFET 301 and a PFET 302. FIG. 3 illustrates a transistor pair 400, which also comprises an NFET 401 and a PFET 402.

With regard to the transistor pair 300, the NFET 301 is formed on an N-well 375A, and comprises a gate 320A, a drain region 330A, and a source region 340A. The PFET 302 is formed on a P-well 375B, and comprises a gate 320B, a drain region 330B, and a source region 340B. The NFET 301 and PFET 302 are separated by a shallow trench isolation (STI) region 380.

The NFET 301 is formed over a BOX region 370A and the PFET 302 is formed over a BOX region 370B. The NFET 301 and PFET 302 respectively comprise fully depleted regions 350A and 350B. The fully depleted regions 350A, 350B are respectively located above the BOX regions 370A, 370B and between the source and drain regions of the FETs 301, 302.

With regard to the transistor pair 400, the NFET 401 is formed on a P-well 475A, and comprises a gate 420A, a drain region 430A, and a source region 440A. The PFET 402 is formed on a P-well 475B, and comprises a gate 420B, a drain region 430B, and a source region 440B. The NFET 401 and PFET 402 are separated by a shallow trench isolation (STI) region 480.

The NFET 401 is formed over a BOX region 470A and the PFET 440B is formed over a BOX region 470B. The NFET 402 and PFET 440B respectively comprise fully depleted regions 450A and 450B. The fully depleted regions 450A, 450B are located above the BOX regions 470A, 470B and between the source and drain regions of the FETs 401, 402.

Figure 4:
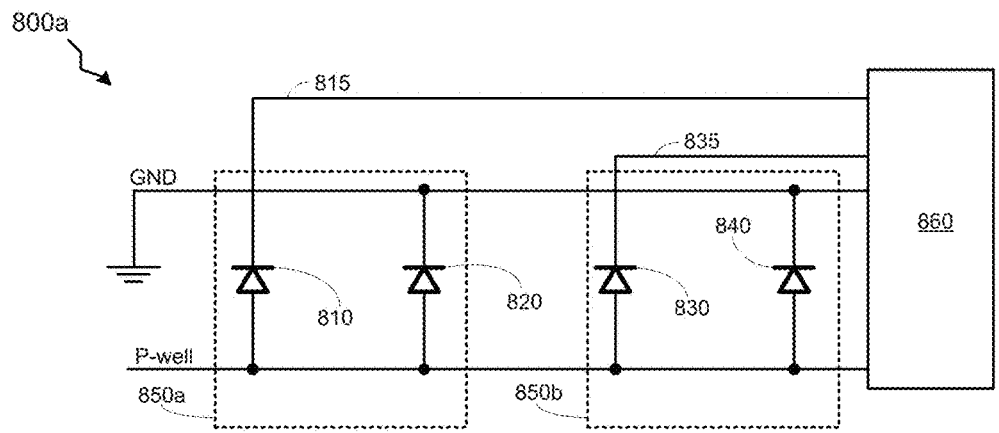
FIG. 4 illustrates an exemplary circuit representation of an antenna diode implementation for a standard cell, in accordance with embodiments herein.
Figure 5:
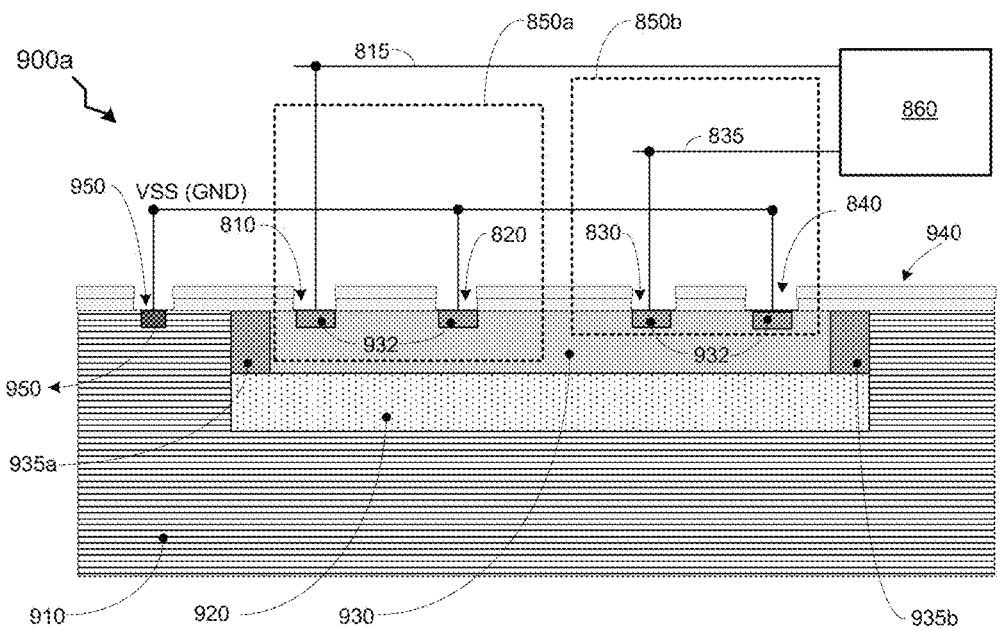
FIG. 5 illustrates a cross-sectional depiction of a SOI device substrate implementing the antenna diode circuitry corresponding to FIG. 4, in accordance with embodiments herein.

Many devices, such as standard cells and memory devices, may be manufactured using FDSOI technology. Antenna diode circuits may be implemented in order to reduce adverse antenna effects that may occur during manufacturing processes. Turning now to FIG. 4, an exemplary circuit representation of an antenna diode implementation for a standard cell, in accordance with embodiments herein, is illustrated. FIG. 5 illustrates a cross-sectional depiction of a SOI device substrate implementing the antenna diode circuitry corresponding to FIG. 4.

The term "antenna diode" may include one or more diodes that are configured to reduce or substantially compensate for charges that may be built-up on a portion of an integrated circuit on a semiconductor wafer. For example an antenna diode implementation may be configured on an integrated circuit on a semiconductor wafer to reduce or substantially compensate for charges built up (e.g., from processing) on a signal line or a power line.

Referring simultaneously to FIGS. 4 and 5, FIG. 4 shows a circuit representation 800a of an antenna diode implementation is illustrated. FIG. 5 illustrates a corresponding semiconductor wafer 900a that comprises a P-sub layer 910, upon which a deep N-well 920 layer is formed. The deep N-well layer 920 may be of a higher voltage or a lower voltage as compared to the voltage levels of other portions of the wafer 900a. A P-well region 930 is formed above the deep N-well layer 920. A plurality of BOX regions 940 are formed at the top portions of the semiconductor wafer 900b. A plurality of N+ regions 932 are formed within the top portions of the P-well regions, between the BOX regions 940, for forming the diodes (80, 820, 830, 840). The P-well region 930 may be surrounded by N-well features 935a, 935b, formed above the deep N-well layer 920. During processing operations, the P-well region 930 is floating.

The circuit 800a may comprise a $1^{st}$ antenna cell 850a and a $2^{nd}$ antenna cell 850b coupled to a functional or standard cell 860. The functional cell 860 may comprise a plurality of transistors that are formed on an n-well and an isolated p-well, which are formed on a deep n-well. In one embodiment, the n-well is electrically coupled to the deep n-well.

The $1^{st}$ antenna cell 850a is capable of dissipating charge accumulated on a $1^{st}$ signal 815 from the functional cell 860, while the $2^{nd}$ antenna cell 850b is capable of dissipating charge accumulated on a $2^{nd}$ signal 835 from the function cell 860. The $1^{st}$ antenna cell 850a may comprise a common forward-bias common antenna diode 820, wherein the cathode of the diode 820 is operatively coupled to a VSS (ground) node, and the anode is coupled to the P-well region 930 (FIG. 5). The cathode of the antenna diode 820 is connected to the P-sub contact 950 (FIG. 5). The $1^{st}$ antenna cell 850a also comprises a reverse-bias antenna diode 810, wherein the anode of the diode 810 may be connected to the p-well node 930, and the cathode is coupled to the $1^{st}$ signal 815.

As described above, the reverse-bias diode 810 is coupled to the forward bias diode 820 (via P-well 930) and to a $1^{st}$ signal line 815. The combination of the forward bias diode 820 and the reverse bias diode 810 operate to protect the $1^{st}$ signal line 815 from excessive charges built up on the line 815. The forward bias diode 820 provides for a current path via the reverse bias diode 810 for discharging the accumulated charges from the $1^{st}$ signal line 815. As shown in FIG. 5, the diode 810 is coupled to the P-well region 930 (effectively coupling it to a node of the forward bias diode 820), and to the $1^{st}$ signal line 815. In this manner, excessive charges built up of the $1^{st}$ signal line 815 may be dissipated to ground through the diodes 810, 820.

The $2^{nd}$ antenna cell 850b may comprise a common forward-bias antenna diode 840, wherein the cathode of the diode 840 is operatively coupled to a VSS (ground) node, and the anode is coupled to the P-well region 930 (FIG. 5). The cathode of the antenna diode 840 is connected to the P-sub contact 950 (FIG. 5). The $2^{nd}$ antenna cell 850b also comprises a reverse-bias antenna diode 830, wherein the anode of the diode 830 may be connected to the p-well node 930, and the cathode is coupled to the $2^{nd}$ signal 835.

The reverse-bias diode 830 is coupled to the forward bias diode 840 and to the $2^{nd}$ signal line 835. The combination of the forward bias diode 840 and the reverse bias diode 830 operate to protect the $2^{nd}$ signal line 835 from excessive charges built up on the line 835. The forward bias diode 840 provides for a current path via the reverse bias diode 830 for discharging the accumulated charges from the $2^{nd}$ signal line 835. As shown in FIG. 5, the diode 830 is coupled to the P-well region 930 (effectively coupling it to a node of the forward bias diode 840), and to the signal line 835. In this manner, excessive charges built up of the $2^{nd}$ signal 835 may be dissipated to ground through the diodes 830, 840.

The configuration exemplified in FIGS. 4 and 5 provide for utilizing a single common, forward bias diode in combination with a reverse bias diode to protect a signal line from excessive charge accumulation. This arrangement provides for an efficient usage of antenna diodes and a reduction is die area.

Figure 6:
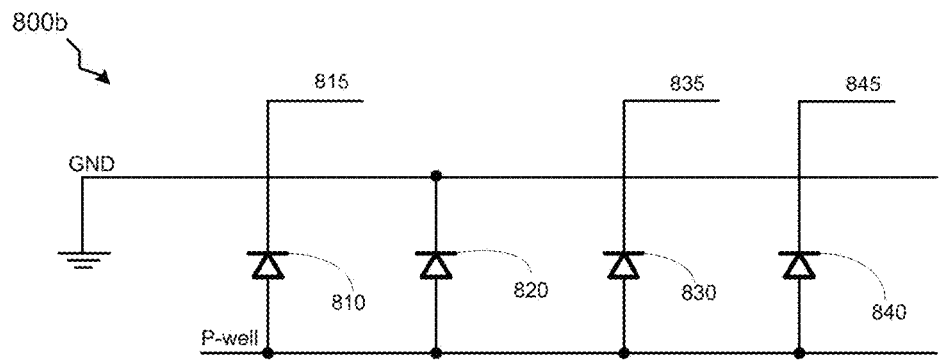
FIG. 6 illustrates an exemplary circuit representation of an antenna diode implementation for a memory device, in accordance with embodiments herein.
Figure 7:
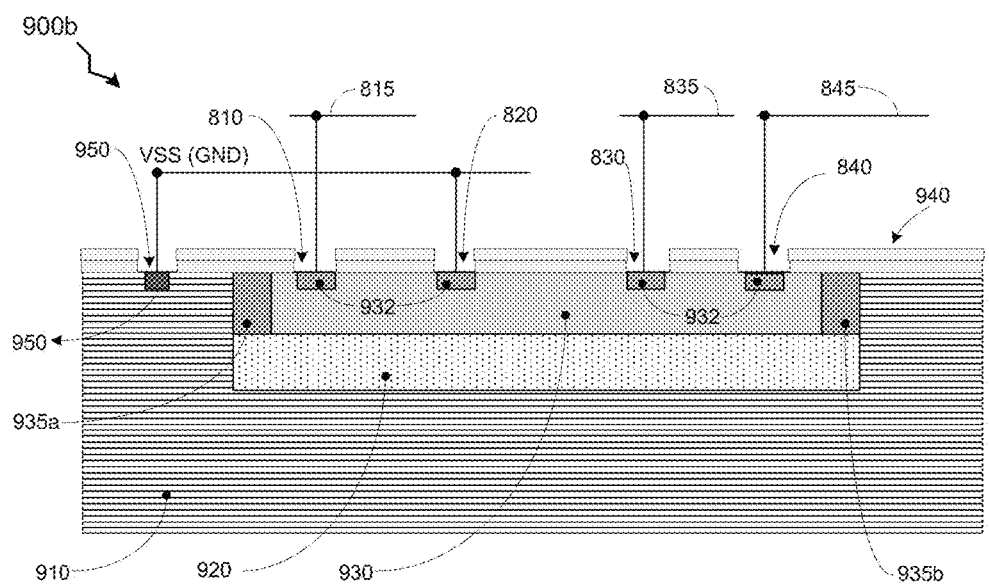
FIG. 7 illustrates a cross-sectional depiction of a SOI device substrate implementing the antenna diode circuitry corresponding to FIG. 6, in accordance with embodiments herein.

Turning now to FIG. 6, an exemplary circuit representation of an antenna diode implementation, in accordance with embodiments herein, is illustrated. FIG. 7 illustrates a cross-sectional depiction of a SOI device substrate implementing the antenna diode circuitry corresponding to FIG. 6.

Referring simultaneously to FIGS. 6 and 7, FIG. 6, a circuit representation 800b of the antenna diode implementation, is illustrated. FIG. 7 illustrates a corresponding semiconductor wafer 900b that comprises a P-sub layer 910, upon which a deep N-well 920 layer is formed. A P-well region 930 is formed above the deep N-well layer 920. A plurality of BOX regions 940 are formed at the top portion of the semiconductor wafer 900b. A plurality of N+ regions 932 are formed within the top portions of the P-well regions, between the BOX regions 940, for forming the diodes (810, 820, 830, 840). The P-well region 930 may be surrounded by N-well features 935a, 935b, formed above the deep N-well layer 920. During processing operations, the P-well region 930 is floating.

The circuit 800b (FIG. 6) may comprise a common forward-bias antenna diode 820, which is operatively coupled to a VSS (ground) node, as well as to a node coupled to the P-well region 930 (FIG. 7). The antenna diode 820 is connected to the P-sub contact 950. Multiple reverse-bias antenna diodes may be connected to the forward-bias diode 820, wherein each of the reverse-bias diodes may be used to protect a signal line.

In the circuit 800b, a $1^{st}$ reverse-bias diode 810 is coupled to the forward bias diode 820 and to a $1^{st}$ signal line 815. The combination of the forward bias diode 820 and the $1^{st}$ reverse bias diode 810 operate to protect the $1^{st}$ signal line 815 from excessive charges built up on the line 815. The common forward bias diode 820 provides for a current path via the $1^{st}$ reverse bias diode 810 for discharging the accumulated charges from the $1^{st}$ signal line 815. As shown in FIG. 7, the diode 810 is coupled to the P-well region 930 (effectively coupling it to a node of the forward bias diode 820), and to the signal line 815.

Similarly, as shown in FIG. 7, a $2^{nd}$ reverse bias diode 830 is coupled to the common forward bias diode 820 and to a $2^{nd}$ signal line 835. The combination of the $2^{nd}$ reverse bias diode 830 and the common forward bias diode 820 operate to protect the $2^{nd}$ signal line 835 from excessive charges built up on the line 835. As shown in FIG. 7, the diode 830 is coupled to the P-well region 930 and to a $2^{nd}$ signal line 835. Further, a $3^{rd}$ reverse-bias diode 840 is coupled to the common forward bias diode 820 and to a $3^{rd}$ signal line 845. The combination of the diode 840 and the common forward bias diode 820 operate to protect the $3^{rd}$ signal line 845 from excessive charges built up on the line 845. As shown in FIG. 7, the diode 840 is coupled to the P-well region 930 and to the $3^{rd}$ signal line 845.

The configuration exemplified in FIGS. 6 and 7 provide for utilizing a single common, forward bias diode in combination with a plurality of reverse bias diodes to protect a plurality of signal lines from excessive charge accumulation. Therefore, for a memory device that comprises various components arranged in a predetermined pitch, the diode circuitry described in FIGS. 6 and 7 may be placed strategically based on the predetermined pitch. For example, the common forward bias diode may be positioned in one region and multiple signal diodes may be placed in the pitch-based memory array region. This arrangement provides for an efficient usage of antenna diodes and a reduction is die area.

Figure 8:
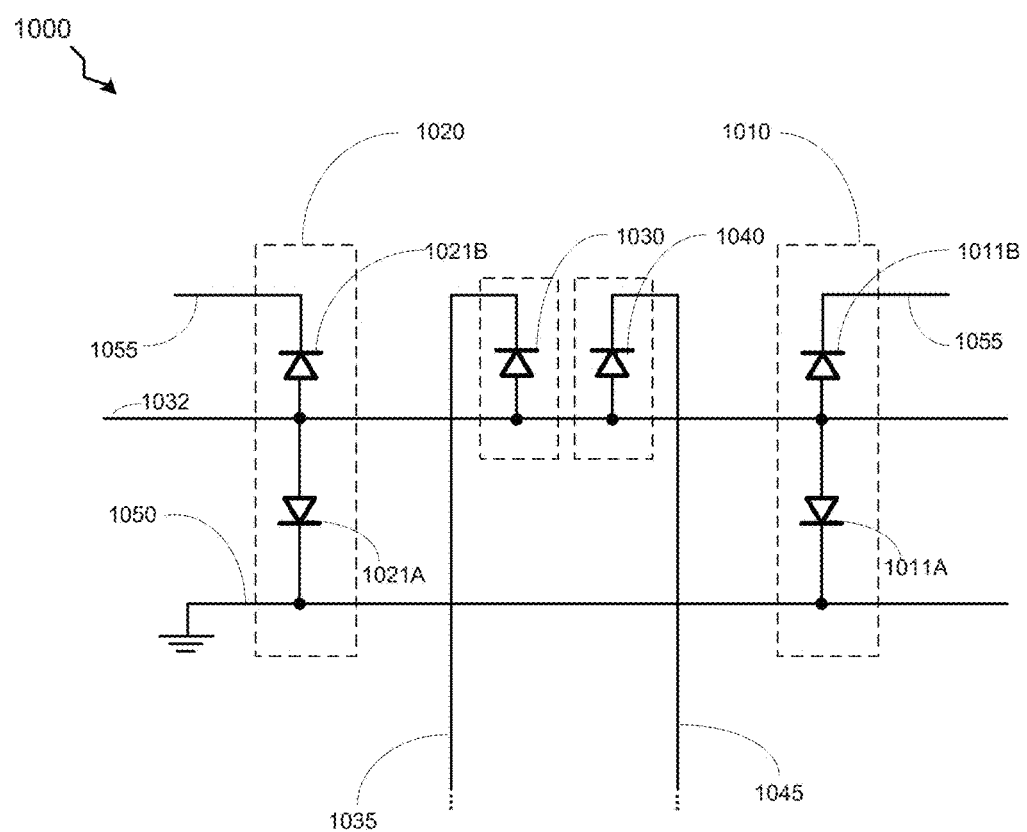
FIG. 8 illustrates a stylized depiction of a plurality of reverse and forward bias antenna diodes that may be placed in a memory device, in accordance with embodiments herein.
Figure 9:
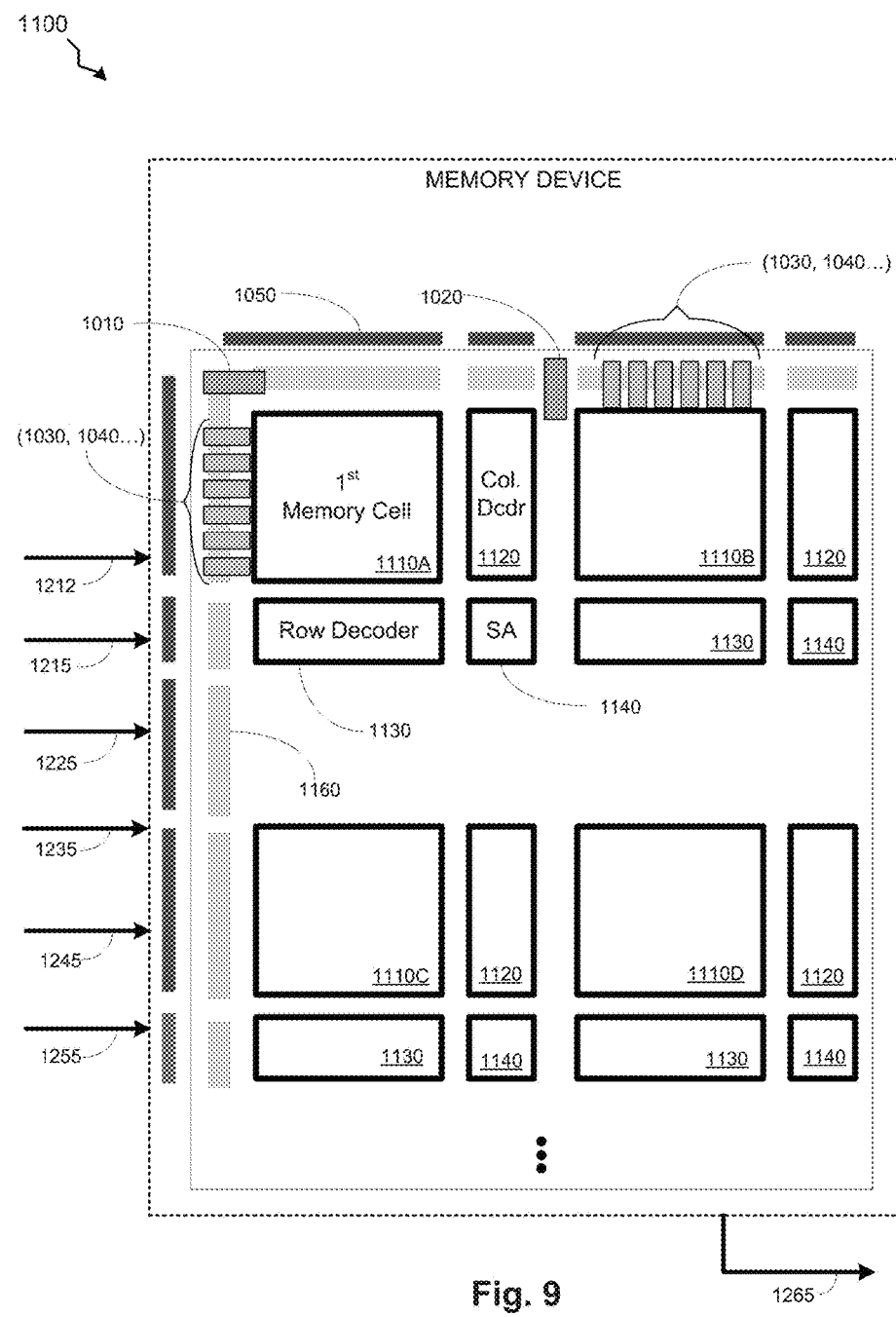
FIG. 9 illustrates a stylized block diagram depiction of a memory device comprising components in a predetermined pitch, in accordance with embodiments herein.

Turning now to FIGS. 8 and 9, FIG. 8 illustrates a stylized depiction of a plurality of reverse and forward bias antenna diodes that may be placed in a memory device, in accordance with embodiments herein. FIG. 9 illustrates a stylized block diagram depiction of a memory device 1100 comprising components in a predetermined pitch, in accordance with embodiments herein.

FIG. 8 illustrates an antenna diode circuit 1000 capable of reducing charges built up on signal or power lines on an integrated circuit on a semiconductor wafer. The circuit 1000 comprises a $1^{st}$ common forward bias diode circuit 1010, a $2^{nd}$ common forward bias diode circuit 1020, a $1^{st}$ reverse bias antenna diode 1040, and a $2^{nd}$ reverse bias antenna diode 1030. The $1^{st}$ common forward bias diode circuit 1010 comprises a pair of common forward-bias antenna diodes: a diode 1011A coupled to a P-well node 1032 and to a VSS node 1050; and a diode 1011B coupled to the P-well node 1032 and a VDD node 1055. The $2^{nd}$ common forward bias diode circuit 1020 comprises a pair of common forward-bias antenna diodes: a diode 1021A coupled to a P-well node 1032 and to a VSS node 1050; and a diode 1021B coupled to the P-well node 1032 and a VDD node 1055.

The reverse bias antenna diode 1040 is coupled to the $1^{st}$ forward bias diode circuit 1010 via the P-well 1032, and to a $1^{st}$ signal line 1045. The combination of the $1^{st}$ forward bias diode circuit 1010 and the $1^{st}$ reverse bias antenna diode 1040 operate to protect the $1^{st}$ signal line 1045 from excessive charges built up on the line 1045. That is, a current path is provided through the $1^{st}$ forward bias diode circuit 1010 from the $1^{st}$ reverse bias diode 1040 in order to at least partially dissipate the charges built-up on of the $1^{st}$ signal line 1045.

Similarly, the $2^{nd}$ reverse bias antenna diode 1030 is coupled to the $2^{nd}$ forward bias diode circuit 1030 via the P-well node 1032, and to a $2^{nd}$ signal line 1035. The combination of the $2^{nd}$ forward bias diode circuit 1020 and the $2^{nd}$ reverse bias antenna diode 1030 operate to protect the $2^{nd}$ signal line 1035 from excessive charges built up on the line 1035. A current path is provided through the $2^{nd}$ forward bias diode circuit 1020 from the $2^{nd}$ reverse bias diode 1030 in order to address the charges built-up on the $2^{nd}$ signal line 1035.

The common forward bias diode circuits 1010, 1020 are capable of sinking current from the reverse bias diodes 1040, 1030 when the diodes 1040, 1030 are in a breakdown state if there is sufficient charge built up on signal lines. For example, a plasma implantation process may cause charge buildup on various signal lines. The circuit combinations described herein are capable of protecting these signal lines from excessive charge build up during processing of semiconductor wafers.

Although a limited number of diodes are illustrated in the circuit 1000 for ease of description, the circuit 1000 may comprise additional common forward bias diodes, as well as additional antenna diodes operatively coupled to signal or power lines on an integrated circuit.

The various components of the memory device 1100 (FIG. 9) may be arranged according to a predetermined pitch. For example, a plurality of memory arrays and other circuitry may be arranged in a repeating array. The common, forward bias diode circuits 1010, 1020 may be strategically placed between the array components, wherein individual reverse bias diodes may be utilized with the forward bias diodes to protect predetermined signal or power lines from charge buildup.

In one embodiment, as shown in FIG. 9, a plurality of memory cells 1110A through 1110D (collectively "1110") may be arranged according to a predetermined pitch. Each of the memory cells 1110 may be operatively coupled to support circuitry (e.g., select/enable circuits, etc.), which are also arranged in an array according to the pitch.

For the sake of clarity and ease of description, only the memory cell 1110A and accompanying circuitry are described, however, those skilled in the art would appreciate that the other memory cells 1110 may also comprise similar circuitry. The memory cell 1110A may comprise word lines that store data words. The memory cell 1110A may also be addressed by selecting particular columns associated with the word lines. The memory cell 1110A is addressed by the row decoder 1130 and the column decoder 1120. A row address 1212 is sent to the memory device 1100 and is used by the row decoder 1130 to address a specific word line of the memory cell 1110A. A column address 1215 is also sent to the memory device 1100 and is used by the column decoder 1120 to address a specific column of the memory cell 1110A. In order to write data into the memory device 1100, a data-in signal 1225 comprising data to be written is provided. This data is stored in the targeted portion in the memory device 1100 based on the row and column addresses 1212, 1215.

The assertion of a write signal 1235 invokes a write operation of the data into the memory cell 1110A. Similarly, when data is to be read from the memory 1100, the row and column addresses 1212, 1215 are used to extract the data, which may be placed onto the signal data-out 1265. The assertion of a read signal 1245 invokes a read operation of the data from the memory array 1100. The assertion of the output enable signal 1255 causes the data read from the memory cell 1110A to be provided onto the I/O signal 1265.

A sense amp 1140 operatively coupled to each of the memory cell 1110A affects the speed of the read and write operations. The sense amp 1140 affects the speed at which data from the data-in signal 1225 is stored into the memory cell 1110A. Further, the sense amp 1140 affects the speed at which data on the data-out signal 1265 is provided out of the memory cell 1110A.

FIG. 9 also illustrates a VSS line 1050, which may be utilized as a ground node for the common antenna diode circuits 1010, 1020. Further, FIG. 9 illustrates a deep N-well structure 1160 along the edge of the array arrangement of memory cells 1110.

Referring simultaneously to FIGS. 8 and 9, during processing operations, charges may accumulate on signal lines, such as the $1^{st}$ and $2^{nd}$ signal lines 1045, 1035. Between sets of memory cells 1100 and accompanying circuitry (column/row decoder circuitry, sense amp circuitry, etc.), one or more common antenna diode circuits 1010, 1020 may be positioned above the structure 1160. For example, the circuits 1010 may be placed adjacent the memory cell 1110A, wherein the common diode circuit 1020 may be placed between the column decoder 1120 and the memory cell 1140B. Further, a plurality of reverse bias antenna diodes (e.g., 1030, 1040) may be positioned adjacent the memory cell 1110A. These reverse bias antenna diodes operate with the common forward bias diode circuit 1010 to protect various signal lines or power lines from excessive charge buildup.

Similarly, a plurality of reverse bias antenna diodes (e.g., 1030, 1040) may be positioned adjacent the memory cell 1110B. These reverse bias antenna diodes operate with the common forward bias diode circuit 1020 to protect various signal lines or power lines from excessive charge buildup. Therefore, multiple reverse bias diodes may be connected to a common P-well diode in order to protect a plurality of signals, while reducing the die area required to protect those signals, as compared to prior art methods. Those skilled in the art having benefit of the present disclosure would appreciate that the common forward bias diode circuit in combination with the multiple reverse bias diodes may be implemented in various portions of a device, such as the memory device 1100, to protect various signal and/or power lines on a semiconductor wafer.

In some embodiments, common diode circuits may be placed in the intersection of row decoders and column decoders, wherein a plurality of reverse diodes may be coupled to signal lines to protect those lines. In this manner, the area used to place diodes to protect signals may be reduced.

Figure 10:
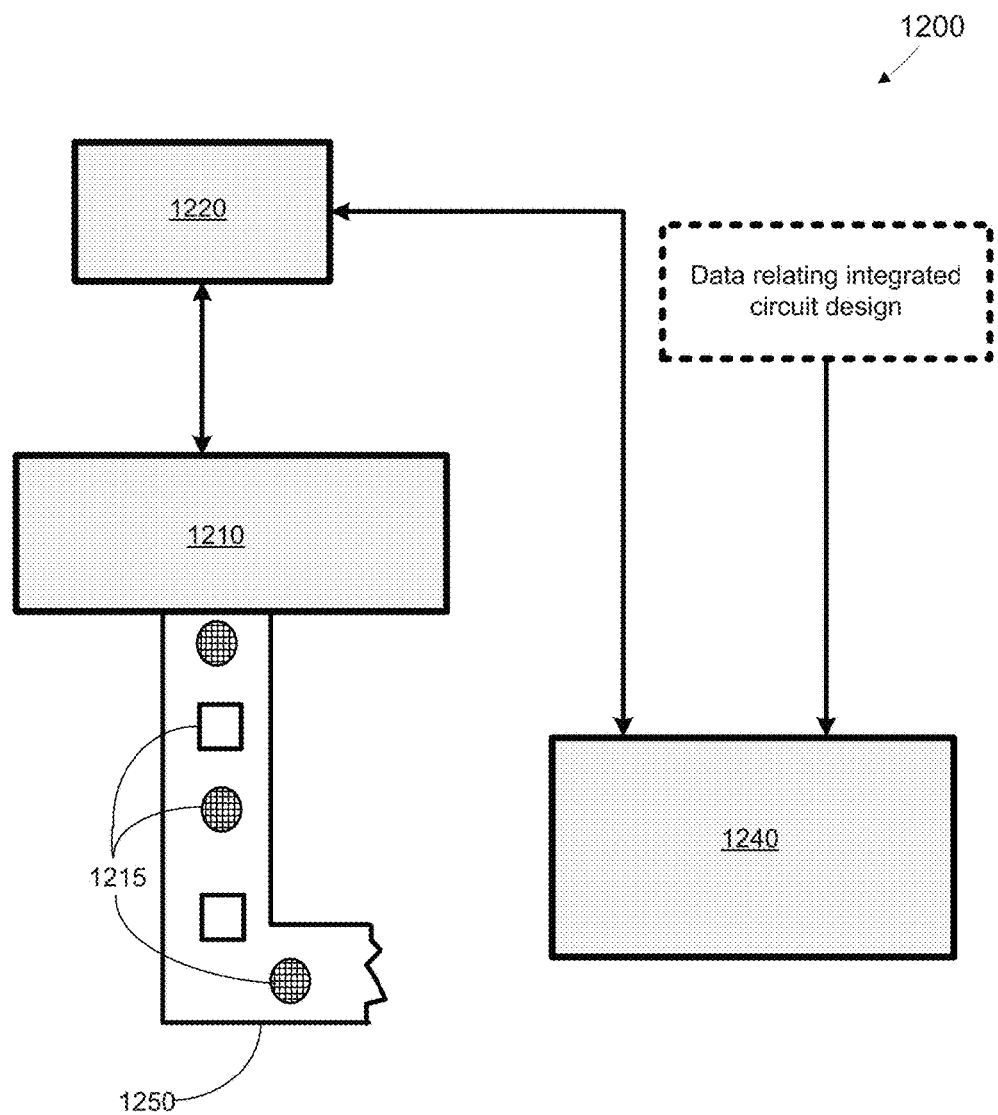
FIG. 10 illustrates a stylized depiction of a system for fabricating a memory device comprising antenna diode circuitry, in accordance with some embodiments herein.

Turing now to FIG. 10, a stylized depiction of a system for fabricating a memory device comprising FD SOI PMOS and NMOS devices, in accordance with some embodiments herein, is illustrated. The semiconductor device processing system 1210 may comprise various processing stations, such as etch process stations, photolithography process stations, CMP process stations, etc. One or more of the processing steps performed by the processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. The production of integrated circuits by the device processing system 1210 may be based upon the circuit designs provided by the integrated circuits design unit 1240. The processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may comprise a plurality of processing steps, e.g., the $1^{st}$ process step, the $2^{nd}$ process set, etc., as described above.

In some embodiments, the items labeled "1215" may represent individual wafers, and in other embodiments, the items 1215 may represent a group of semiconductor wafers, e.g., a "lot" of semiconductor wafers. The integrated circuit or device 1215 may be a transistor, a capacitor, a resistor, a memory cell, a processor, and/or the like. In one embodiment, the device 1215 is a transistor and the dielectric layer is a gate insulation layer for the transistor.

The integrated circuit design unit 1240 of the system 1200 is capable of providing a memory device design that may be manufactured by the semiconductor processing system 1210. The design unit 1240 may receive data relating to the design specifications for the integrated circuits to be designed for the memory device. In one embodiment, the integrated circuit design unit 1240 may perform a modeling of a device design and/or testing of processed semiconductor devices to determine whether certain regions of the design or device should be provided with the capability to discharge of accumulated charges on signal lines, as described above. The integrated circuit design unit 1240 is capable of analyzing and performing design adjustments to provide implementation of common forward bias circuits and reverse bias diodes to protect predetermined signal lines or power lines from excessive charge buildup.

In other embodiments, the integrated circuit design unit 1240 may perform an automated determination of area that require design adjustments to implement common forward bias circuits and reverse bias diodes, and automatically incorporate design adjustments into the device design. For example, once a designer or a user of the integrated circuit design unit 1240 generates a design using a graphical user interface to communicate with the integrated circuit design unit 1240, the unit 1240 may perform automated modification of the design.

The system 1200 may be capable of performing analysis and manufacturing of various products involving various technologies. For example, the system 1200 may design and production data for manufacturing devices of CMOS technology, Flash technology, BiCMOS technology, power devices, controllers, processors, memory devices (e.g., DRAM devices), NAND memory devices, and/or various other semiconductor technologies.

Although in some examples, circuits herein were described in terms of FD SOI devices for consistency and ease of illustration, those skilled in the art would appreciate that concepts described herein may also apply to other SOI devices (e.g., partially depleted (PD) SOI devices) and remain within the scope of embodiments herein. The concepts and embodiments described herein may apply to a plurality of types of VT families of devices, including but limited to, FD SOI LVT transistors, FD SOI SLVT transistors, FD SOI RVT transistor, FD SOI HVT transistors, or combination herein, and remain within the scope of the embodiments herein. The concepts and embodiments herein may be applied to any VT family of transistors in the technology described above (e.g., if ULVt or UHVt is generated).

The system 1200 may be capable of manufacturing and testing various products that include transistors with active and inactive gates involving various technologies. For example, the system 1200 may provide for manufacturing and testing products relating to CMOS technology, flash technology, BiCMOS technology, power devices, memory devices (e.g., DRAM devices), NAND memory devices, processors, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a standard cell comprising at least one transistor formed on an n-well region and an isolated p-well region, wherein said n-well region and said isolated p-well region are formed on a deep n-well region;
   a first antenna cell coupled to a first signal line that is operatively coupled to said standard cell, said first antenna cell comprising:
      a first antenna diode formed on said isolated p-well region, wherein a cathode of said first antenna diode is operatively coupled to said first signal line and an anode of said first antenna diode is operatively coupled to said isolated p-well region; and
      a second antenna diode formed on said isolated p-well region, wherein an anode of said second antenna diode is operatively coupled to said isolated p-well, and a cathode of the second antenna diode is operatively coupled to a ground node for discharging accumulated charges on said first signal line.

2. The apparatus of claim 1 further comprising a substrate contact operatively coupled to said isolated p-well region and to a substrate region for discharging said accumulated charge on said first signal line.

3. The apparatus of claim 1, further comprising a second antenna cell coupled to a second signal line that is operatively coupled to said standard cell, said second antenna cell comprising:
   a third antenna diode formed on said isolated p-well region, wherein the cathode of said third antenna diode is operatively coupled to said second signal line and the anode of said third antenna diode is operatively coupled to said isolated p-well region; and
   a fourth antenna diode formed on said isolated p-well region, wherein the anode of said fourth antenna diode is operatively coupled to said isolated p-well and the cathode of said fourth antenna diode is operatively coupled to a ground node for discharging accumulated charges on said second signal line.

4. The apparatus of claim 1, wherein said standard cell is at least one of an inverter, an AND gate, a NAND gate, an OR gate, a NOR gate, and an XOR gate.

5. The apparatus of claim 1, wherein said standard cell is coupled to a VSS power line and to a VDD ground line.

6. The apparatus of claim 1, wherein said accumulated charges are formed as a result of a semiconductor fabrication process step performed on a portion of said apparatus.

7. The apparatus of claim 1, wherein said standard cell is comprised of at least one of a fully depleted silicon-on-insulator (FD SOI) transistor, wherein said FD SOI transistor is at least one of an FD SOI low voltage threshold (LVT) transistor, an FD SOI super low voltage threshold (SLVT) transistor, an FD SOI regular voltage threshold (RVT) transistor, or an FD SOI high voltage threshold (HVT) transistor.

8. An apparatus, comprising:
a memory device comprising at least one transistor formed on an n-well region and an isolated p-well region, wherein said n-well region and said isolated p-well region are formed on a deep n-well region, the memory device operatively coupled to a first signal line;
a first antenna diode formed on said isolated p-well region, wherein a cathode of said first antenna diode is operatively coupled to said first signal line and an anode of said first antenna diode is operatively coupled to said isolated p-well region; and
a second antenna diode formed on said isolated p-well region, wherein an anode of said second antenna diode is operatively coupled to said isolated p-well, and a cathode of the second antenna diode is operatively coupled to a ground node for discharging accumulated charges on said first signal line.

9. The apparatus of claim 8, further comprising a substrate contact operatively coupled to said isolated p-well region and to a substrate region for discharging said accumulated charge on said first signal line.

10. The apparatus of claim 8, further comprising a third antenna diode formed on said isolated p-well region, wherein the cathode of said third antenna diode is operatively coupled to a second signal line and the anode of said third antenna diode is operatively coupled to said isolated p-well region for discharging accumulated charges on said second signal line operatively coupled to said memory device.

11. The apparatus of claim 8, wherein said first signal line is coupled to a memory cell of said memory device and said second signal line is operatively coupled to a memory control cell of said memory device.

12. The apparatus of claim 8, wherein said memory device is a static random access memory (SRAM) device.

13. A method, comprising:
providing a first common diode operatively coupled to a ground node and to an isolated p-well region that is formed over a deep n-well region that is adjacent to an n-well region in a semiconductor device;
providing a first antenna diode formed on an said isolated p-well region and operatively coupled to a first signal line of said semiconductor device for discharging accumulated charges on said first signal line; and
providing a second antenna diode formed on said isolated p-well region and operatively coupled to a second signal line of semiconductor device for discharging accumulated charges on said second signal line.

14. The method of claim 13, further comprising providing a second common diode operatively coupled to said ground node and to said isolated p-well region and to a VDD node.

15. The method of claim 13, further comprising performing a modeling of a device design to identify said first and second signal lines of a functional cell on which charges will build up during a processing operation.

16. The method of claim 14, wherein:
providing said first common diode comprises placing said first common diode between a first memory cell and a second memory cell in an array in a memory device; and
providing said second common diode comprises placing said second common diode between said second memory cell and a third memory cell in said array.

17. The method of claim 16, wherein said first and second diodes are placed along said first memory cell proximate the first common diode.

18. The method of claim 13, wherein providing said first common diode comprises placing said first common diode at an intersection of a row decoder and a column decoder of a memory device.

19. The method of claim 13, wherein:
providing said first antenna diode comprises coupling a cathode of said first antenna diode to said first signal line and coupling said anode of said first antenna diode to said isolated p-well region;
providing said first common diode comprises coupling the anode of the first common diode to said isolated p-well region and coupling the cathode of said first common diode to a ground node for discharging accumulated charges on said first signal line, wherein said first signal line is operatively coupled to a functional cell.

20. The method of claim 19, further comprising providing a substrate contact operatively coupled to said isolated p-well region and to a substrate region in said semiconductor device for discharging said accumulated charged on said first and second signal lines.

* * * * *